(12) United States Patent
van Schravendijk et al.

(10) Patent No.: US 10,615,169 B2
(45) Date of Patent: Apr. 7, 2020

(54) SELECTIVE DEPOSITION OF SIN ON HORIZONTAL SURFACES

(71) Applicant: Lam Research Corporation, Fremont, CA (US)

(72) Inventors: Bart J. van Schravendijk, Palo Alto, CA (US); Awnish Gupta, Hillsboro, OR (US); Patrick A. van Cleemput, West Linn, OR (US); Jason Daejin Park, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/052,401

(22) Filed: Aug. 1, 2018

(65) Prior Publication Data

US 2019/0043876 A1 Feb. 7, 2019

Related U.S. Application Data

(60) Provisional application No. 62/541,262, filed on Aug. 4, 2017.

(51) Int. Cl.
*H01L 21/336* (2006.01)
*H01L 27/11556* (2017.01)
(Continued)

(52) U.S. Cl.
CPC .... *H01L 27/11556* (2013.01); *G11C 16/0408* (2013.01); *G11C 16/0466* (2013.01); *H01L 27/11575* (2013.01); *H01L 27/11582* (2013.01)

(58) Field of Classification Search
CPC ......... H01L 27/11556; H01L 27/11582; G11C 16/0466; G11C 16/0408
(Continued)

(56) References Cited

U.S. PATENT DOCUMENTS 6,399,489 B1 * 6/2002 M'Saad ................ C23C 16/325
438/680
6,953,609 B2 10/2005 Carollo
(Continued)

FOREIGN PATENT DOCUMENTS

JP 2006-032695 2/2006
KR 10-2014-0069326 6/2014

OTHER PUBLICATIONS

U.S. Office Action dated Jul. 28, 2017, issued in U.S. Appl. No. 15/408,291.
(Continued)

*Primary Examiner* — Vu A Vu
(74) *Attorney, Agent, or Firm* — Weaver Austin Villeneuve & Sampson LLP

(57) ABSTRACT

Methods and apparatuses for selectively depositing silicon nitride (SiN) via high-density plasma chemical vapor deposition (HDP CVD) to form a SiN pad on an exposed flat surface of a nitride layer in a 3D NAND staircase structure with alternating oxide and nitride layers are provided. In some embodiments, selective etching is performed to remove undesirable buildup of SiN on sidewalls of the oxide layers of the staircase structure. Nitride layers of the staircase structure are replaced with tungsten (W) to form tungsten wordlines, while the SiN pads are replaced with tungsten to from landing pads, which prevent punchthrough of the tungsten wordlines on the staircase structure by interconnects extending thereto.

16 Claims, 14 Drawing Sheets

(51) Int. Cl.
*G11C 16/04* (2006.01)
*H01L 27/11575* (2017.01)
*H01L 27/11582* (2017.01)

(58) Field of Classification Search
USPC .......................................................... 438/257
See application file for complete search history.

(56) References Cited

U.S. PATENT DOCUMENTS

| | | | |
|---|---|---|---|
| 7,211,525 B1* | 5/2007 | Shanker | C23C 16/0245 |
| | | | 257/E21.279 |
| 9,343,452 B2* | 5/2016 | Yun | H01L 27/1157 |
| 9,391,086 B1 | 7/2016 | Soda et al. | |
| 10,002,787 B2 | 6/2018 | Yu et al. | |
| 2006/0148270 A1* | 7/2006 | Lu | C23C 16/345 |
| | | | 438/763 |
| 2010/0173494 A1 | 7/2010 | Korbin | |
| 2011/0180866 A1 | 7/2011 | Matsuda et al. | |
| 2011/0207323 A1 | 8/2011 | Ditizio | |
| 2012/0077349 A1 | 3/2012 | Li et al. | |
| 2013/0056818 A1 | 3/2013 | Iino et al. | |
| 2013/0084688 A1 | 4/2013 | O'Meara et al. | |
| 2014/0106574 A1 | 4/2014 | Kang et al. | |
| 2014/0187045 A1 | 7/2014 | Hua et al. | |
| 2014/0197470 A1 | 7/2014 | Lee et al. | |
| 2014/0264925 A1 | 9/2014 | Chen | |
| 2014/0363922 A1 | 12/2014 | Chen | |
| 2015/0179466 A1 | 6/2015 | Takayama et al. | |
| 2015/0255385 A1 | 9/2015 | Lee et al. | |
| 2015/0287710 A1 | 10/2015 | Yun et al. | |
| 2016/0005759 A1 | 1/2016 | Kim et al. | |
| 2016/0090649 A1 | 3/2016 | Varadarajan | |
| 2016/0268286 A1 | 9/2016 | Tamura | |
| 2016/0284615 A1 | 9/2016 | Kitajima et al. | |
| 2016/0314986 A1* | 10/2016 | Tominaga | H01L 21/31116 |
| 2017/0221718 A1 | 8/2017 | Tapily | |
| 2017/0316940 A1 | 11/2017 | Ishikawa et al. | |
| 2018/0033614 A1 | 2/2018 | Chandra et al. | |
| 2018/0315758 A1* | 11/2018 | Yoo | H01L 27/11548 |
| 2018/0330985 A1 | 11/2018 | Yu et al. | |
| 2019/0057858 A1 | 2/2019 | Hausmann et al. | |

OTHER PUBLICATIONS

International Search Report and Written Opinion dated Mar. 15, 2018, issued in PCT Application No. PCT/US17/62882.
International Search Report and Written Opinion dated Nov. 19, 2018, in PCT Application No. PCT/US2018/044800.
U.S. Office Action dated Mar. 6, 2019, in U.S. Appl. No. 15/681,268.
International Search Report and Written Opinion dated Feb. 11, 2019, in PCT Application No. PCT/US2018/000331.
U.S. Office Action dated Apr. 18, 2019, in U.S. Appl. No. 15/972,554.
Notice of Allowance dated Oct. 22, 2019, in U.S. Appl. No. 15/972,554.
Final Office Action dated Sep. 16, 2019 in U.S. Appl. No. 15/681,268.

* cited by examiner

SELECTIVE DEPOSITION OF SIN ON HORIZONTAL SURFACES

CROSS-REFERENCE TO RELATED APPLICATION

This application claims priority to U.S. Provisional Patent Application No. 62/541,262, filed Aug. 4, 2017, which is incorporated by reference herein for all purposes.

BACKGROUND

Semiconductor device fabrication involves fabrication of flash memory. As devices shrink, structures for fabricating efficient and multiple memory cells are used to maximize density of memory cells in a memory device. 3D NAND technology addresses challenges associated with two-dimensional NAND technology by stacking memory cells vertically in layers.

SUMMARY

Methods and apparatuses for processing semiconductor substrates are provided herein. One aspect of the disclosure involves a method of processing a semiconductor substrate for fabricating a 3D NAND structure, the method involving providing a substrate having alternating oxide layers and nitride layers arranged in a staircase pattern. Each of the nitride layers has an exposed horizontal surface. Prior to depositing an oxide filler over the staircase pattern, silicon nitride (SiN) is deposited via high-density plasma chemical vapor deposition (HDP CVD) over both the oxide layers and nitride layers. The SiN is deposited selectively on the exposed horizontal surfaces of the nitride layers relative to oxide sidewall surfaces at each layer to form SiN pads.

The deposition of SiN via HDP CVD may involve simultaneously depositing SiN on the exposed horizontal surfaces of the nitride layers to form the SiN pads, while selectively etching SiN deposited on sidewalls of the oxide layers of the staircase pattern relative to the SiN pads. Further, the exposed horizontal surfaces of the nitride layers may be exposed, at each layer, to deposition chemistry to form the SiN pads. Also, sidewalls of the oxide layers of the staircase pattern may be exposed to an etchant to selectively etch SiN deposited on the sidewalls relative to the SiN pads.

Alternatively, in some embodiments, the exposed horizontal surfaces of the nitride layers may be exposed, at each layer, to deposition chemistry prior to the exposure of the oxide layers of the staircase pattern to the etchant. The etchant may comprise plasma species generated from hydrogen gas ($H_2$) or a fluorine-containing gas. In some embodiments, transitioning from depositing SiN to selectively etching SiN deposited on the sidewalls of the oxide layers may involve lowering a bias applied to a pedestal holding the substrate.

In some embodiments, depositing SiN via HDP CVD may involve flowing a silicon-containing reactant and a nitrogen-containing reactant to a HDP CVD chamber.

In some embodiments, the nitride layers may be replaced with tungsten (W) wordlines. The SiN pads may be replaced with tungsten landing pads. Further, after depositing SiN via HDP CVD over the exposed surfaces of the nitride layers, the oxide filler may be deposited over the staircase pattern. The oxide filler may be etched to form vertical vias in the oxide filler. The vertical vias may extend to the tungsten wordlines. The oxide filler may be etched selectively relative to the tungsten landing pads. Tungsten may be deposited in the vias to form interconnects which extend to the wordlines. The tungsten landing pads may be positioned on the wordlines to protect against punchthrough of one or more of the wordlines by one or more of the vias.

In some embodiments, SiN deposited on sidewalls of the oxide layers of the staircase pattern may be selectively etched while leaving deposition of SiN on horizontal surfaces substantially intact.

Another aspect of the disclosure involves a method for processing a substrate with nitride layers positioned between oxide layers forming a staircase structure. Portions of the nitride layers are exposed. SiN deposited from a silicon-containing reactant and a nitrogen-containing reactant through high-density plasma chemical vapor deposition (HDP CVD) may be deposited on flat surfaces of the exposed portions of the nitride layers while a bias is applied to the substrate. Material deposited on sidewalls of the oxide layers of the staircase structure may be removed by etching the material deposited on the sidewalls selective to material deposited on flat surfaces of the exposed portions of the nitride layers. In some embodiments, depositing of the silicon-containing reactant and a nitrogen-containing reactant may be anisotropic. Further, etching material deposited on the sidewalls may involve exposing the sidewalls to plasma species generated from hydrogen gas or a fluorine-containing gas. Still further, depositing and removing material deposited on the sidewalls may be performed either simultaneously or sequentially.

Another aspect involves an apparatus for processing a substrate. The apparatus may include a reactor containing a process chamber. A plasma source may be in fluid communication with and be coupled with the process chamber. A substrate pedestal may be positioned within the process chamber. The substrate pedestal may receive electrical energy provided by an electrode coupled with the substrate pedestal. One or more gas inlets may open into the process chamber and have flow-control hardware associated with the gas inlets. Process gases may be introduced into the process chamber by the gas inlets. A controller may be configured to control the reactor. The controller has a processor and a memory. The processor and the memory are communicatively connected with one another. The processor is at least operatively connected with the flow-control hardware, and the memory stores computer-executable instructions for controlling the processor to at least control the flow-control hardware by: (a) inletting the process gases to the process chamber, the process gases comprising: a silicon-containing reactant; a nitrogen-containing reactant, and hydrogen gas, wherein the ratio of hydrogen gas to the silicon-containing precursor is at least 1:2, (b) applying a bias to the electrode during (a); (c) after (a), lowering the bias applied to the electrode; and (d) during (c), inletting hydrogen ($H_2$) gas or fluorine-containing gas.

These and other features will be described below with reference to the associated drawings.

DETAILED DESCRIPTION

Figure 1:
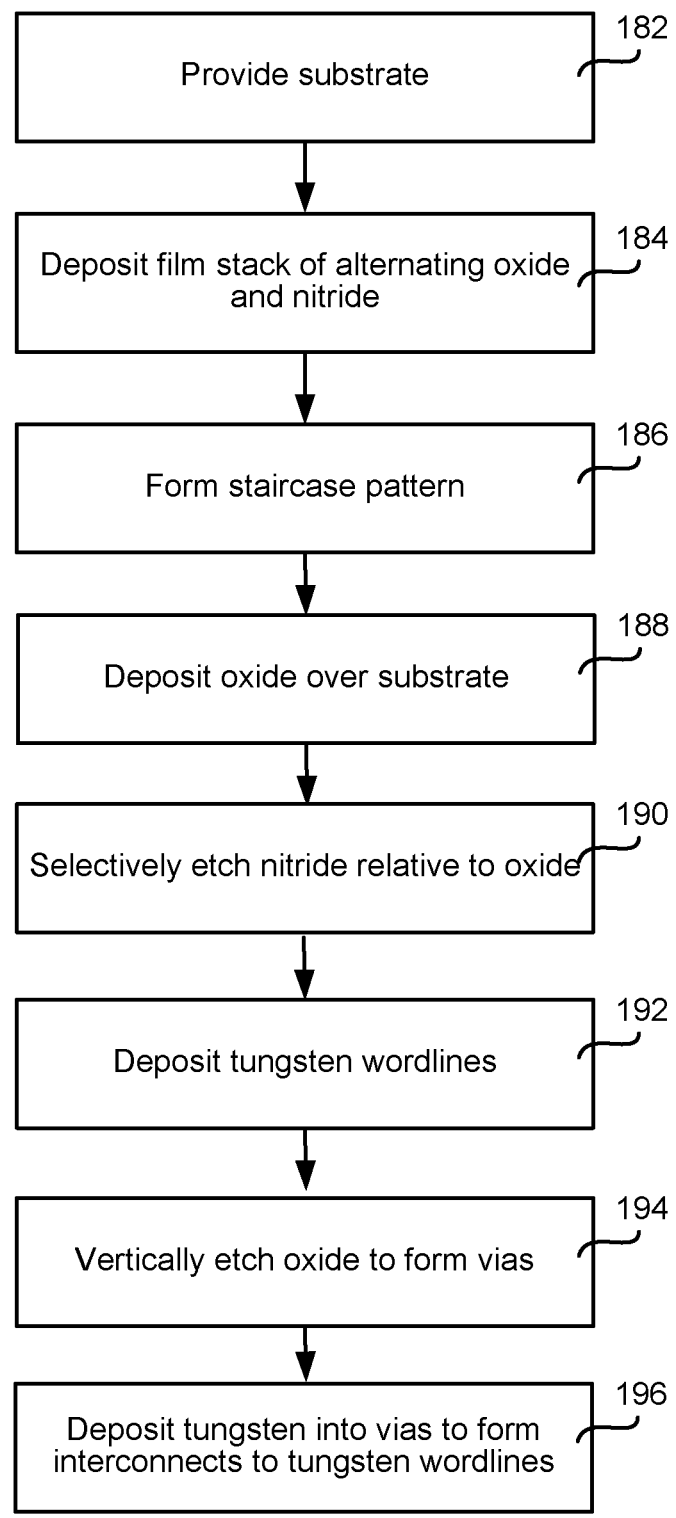
FIG. 1 is a process flow diagram depicting operations for a method.

In the following description, numerous specific details are set forth to provide an understanding of the presented embodiments. The disclosed embodiments may be practiced without some or all of these specific details. In other instances, well-known process operations have not been described in detail to not obscure the disclosed embodiments. Further, while the disclosed embodiments will be described in conjunction with specific embodiments, it will be understood that the specific embodiments are not intended to limit the disclosed embodiments.

The implementations disclosed below describe deposition of a material on a substrate such as a wafer, substrate, or other work piece. The work piece may be of various shapes, sizes, and materials. In this application, the terms "wafer" and "substrate," are used interchangeably.

Semiconductor fabrication often involves fabrication of memory devices. One example is fabrication of a 3D NAND, also referred to as a "vertical NAND" (VNAND), structure. However, existing techniques for forming 3D NAND structures are limited for scaling to smaller devices, and currently available patterning techniques may cause undesirable degradation of various components in the 3D NAND structure.

In current 3D NAND technology, vias may be formed in an oxide filler deposited over alternating oxide and nitride layers that are arranged in a staircase pattern. The vias extend vertically to contact exposed tungsten wordlines, which replace the nitride layers. Metal, such as tungsten, is deposited in the vias to form interconnects which extend to and contact the tungsten wordlines. However, maintaining a sufficient stop distance between various interconnects and their corresponding wordlines may prove difficult, given the variance in height of each layer of wordline relative to the interconnect. Thus, the time required for filling the longest of the interconnects to make to contact with a wordline on a base layer of the staircase pattern may result in inadvertent and undesirable "punchthrough" of shorter interconnects through wordlines positioned higher up on the staircase pattern and into the oxide layers positioned beneath the wordlines. Thus, contact surfaces on wordlines located at higher positions on the staircase may be over-etched relative to wordlines located toward the bottom of the staircase pattern.

Further, increasing the height or number of alternating oxide and nitride layers in a 3D NAND structure may also prove challenging since the height of the alternating layer stack may cause substantial etch and bow issues. To mitigate the impact of etch and bow issues resulting from tall 3D NAND structures, the thickness of each oxide layer or nitride layer may be reduced. However, doing so may further worsen the punchthrough issue described above.

Other remedies to address the above-discussed issues include increasing the contact mask and etch operations, such that over-etch on locations higher on the staircase pattern may be minimized, yet doing so often increases cost and degrades yield.

Alternatively, an etch stop layer may be added over the staircase pattern to address the punchthrough issues described above. However, an etch stop layer that is highly selective may also be selective in the area where the vias are etched, and thus unintentionally block nitride layer removal in the staircase pattern near or within the via area.

Disclosed methods and apparatuses configured to implement the methods provide for the deposition of silicon nitride (SiN) at selected exposed portions of each nitride layer of a staircase pattern to form SiN pads thereon. In some embodiments, the methods include an in situ etch within a high density plasma chemical vapor deposition (HDP CVD) tool. Advantages associated with using HDP CVD to deposit SiN include thin inadvertent sidewall deposition coverage in comparison to other deposition methods. Further, exposure of the SiN pads to etchants, such as etchants generated from hydrogen-containing or fluorine-containing species, delivered isotropically, may remove SiN deposited on sidewalls of the staircase pattern while leaving SiN deposited on horizontal surfaces intact. In some embodiments, SiN deposition may be completed as a single operation, thus minimizing costs and process cycle time. While the methods and tools below are described in the context of forming SiN pads on nitride layers in a 3D NAND structure, they may be employed in any application where selective SiN deposition on horizontal surfaces is sought.

Figure 2:
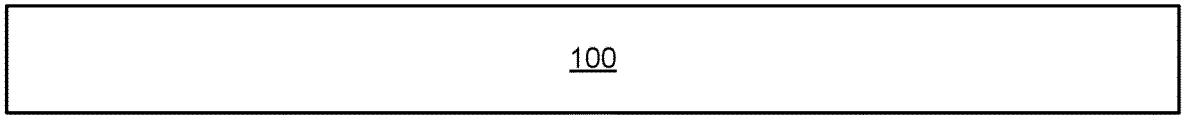
FIGS. 2, 3, and 4A are schematic illustrations of a substrate in a patterning scheme.

FIG. 1 shows a process flow diagram of operations performed in accordance with a method for forming a 3D NAND structure. In operation 182, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 2.

Returning to FIG. 1, in operation 184, a film stack of alternating oxide and nitride films is deposited on the substrate. In various embodiments, the oxide layer deposited is a silicon oxide layer. In various embodiments, the nitride layer deposited is a silicon nitride layer.

Each oxide and nitride layer may be deposited to about the same thickness, such as between about 10 nm and about 100 nm, or about 350 nm in some embodiments. The oxide layers may be deposited at a deposition temperature of between about room temperature and about 600° C. It will be understood that "deposition temperature" (or "substrate temperature") as used herein refers to the temperature that the pedestal holding the substrate is set to during deposition.

Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), or sputtering. In various embodiments, the oxide and nitride layers are deposited by PECVD.

The film stack may include between 48 and 512 layers of alternating oxide and nitride layers. Each oxide or nitride layer constitutes one layer. The film stack including the alternating oxide and nitride layers may be referred to as an oxide-nitride-oxide-nitride (ONON) stack.

Figure 3:
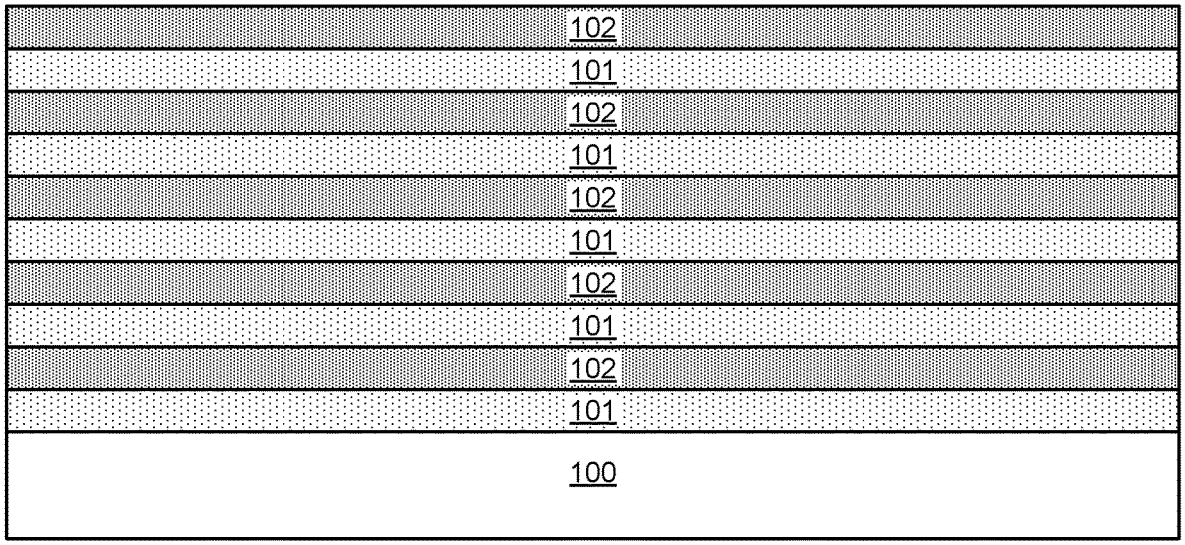

FIG. 3 shows an example schematic illustration of a substrate 100 with alternating oxide 101 and nitride 102 films deposited on the substrate 100. Note that while the structure shown in FIG. 3 shows an oxide deposited first, followed by nitride, oxide, nitride, etc., nitride may be deposited first, followed by oxide, nitride, oxide, etc.

Following deposition of the ONON stack, one or more channels (not shown in FIG. 3) may be etched in the substrate. Subsequently, referring to FIG. 1, in operation 186, a staircase pattern is formed on the substrate. A "staircase pattern" as referred to herein describes two or more steps, each step including an oxide layer and a nitride layer. It will be understood that the top layer of each set of oxide and nitride layers may be either an oxide layer or a nitride layer for formation of steps in a staircase. In various embodiments, the staircase pattern includes between 24 and 256 steps. The staircase pattern may be formed using a variety of patterning techniques. One technique may include depositing a sacrificial layer over the substrate and masking regions of the substrate to etch each set of oxide and nitride layers to form the staircase.

Figure 4A:
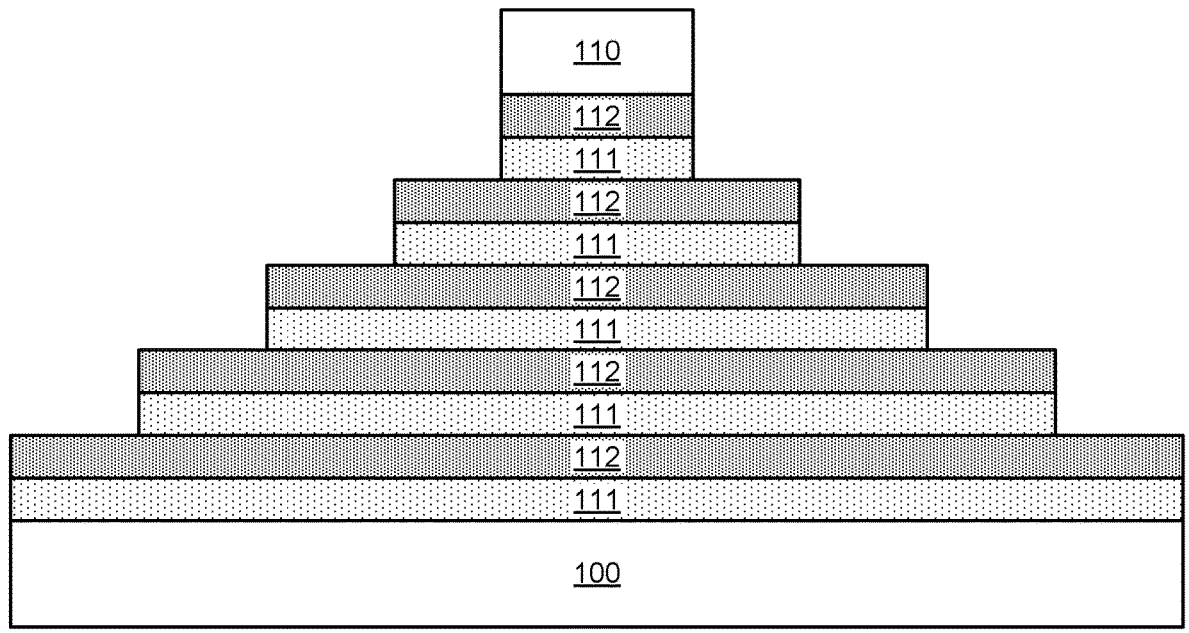

FIG. 4A provides an example of a substrate 100 including a staircase pattern of oxide layers 111 and nitride layers 112 with a hardmask 110 over the topmost nitride layer. Although FIG. 4A shows four steps of a staircase pattern, it will be understood that a staircase pattern may have any number of steps, such as between 24 and 256 steps. Each step includes a nitride layer and an oxide layer. The region of each step extending out from the edge of the step above it may be referred to as an "exposed" region of the step or topmost layer of the step, or portion suitable for deposition thereon.

Figure 4B:
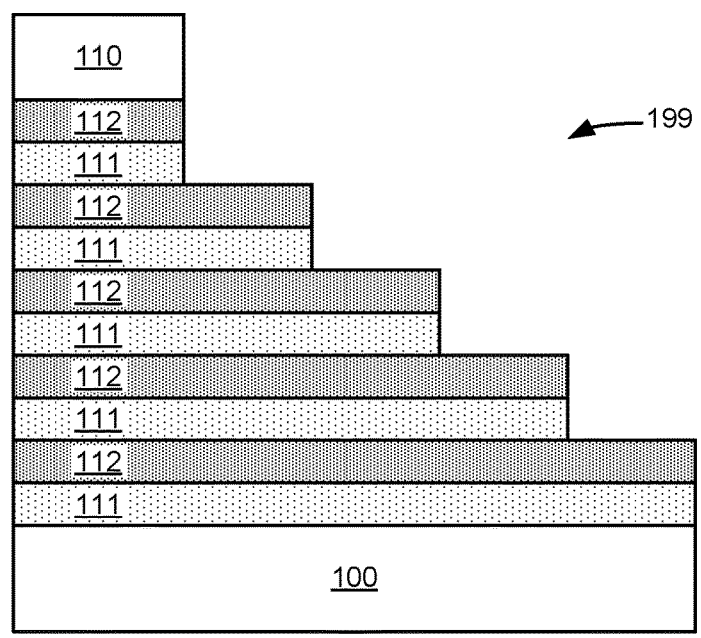
FIG. 4B is a partial view of the substrate shown in FIG. 4A.

A view 199 of the staircase pattern shown in FIG. 4A bisected across, for example, a width-wise direction of the staircase, is shown in FIG. 4B to highlight the tiered structure of the staircase pattern. Oxide layers 111 are positioned parallel to, and in between, nitride layers 112. Each set of one oxide layer 111 followed by one nitride layer 112 is longer than the set immediately above it, thus forming the staircase pattern with exposed regions.

In some embodiments, in operation 188 of FIG. 1, oxide is deposited over the substrate. The oxide may be of the same or of different composition as the oxide deposited in layers of the ONON stack. In various embodiments, the oxide deposited over the substrate is deposited at the same or a different deposition temperature than the deposition temperature used for depositing the oxide layers in the ONON stack. The deposition temperature may be between room temperature and about 600° C. Vertical slits may be subsequently etched into the substrate after depositing oxide.

Figure 5A:
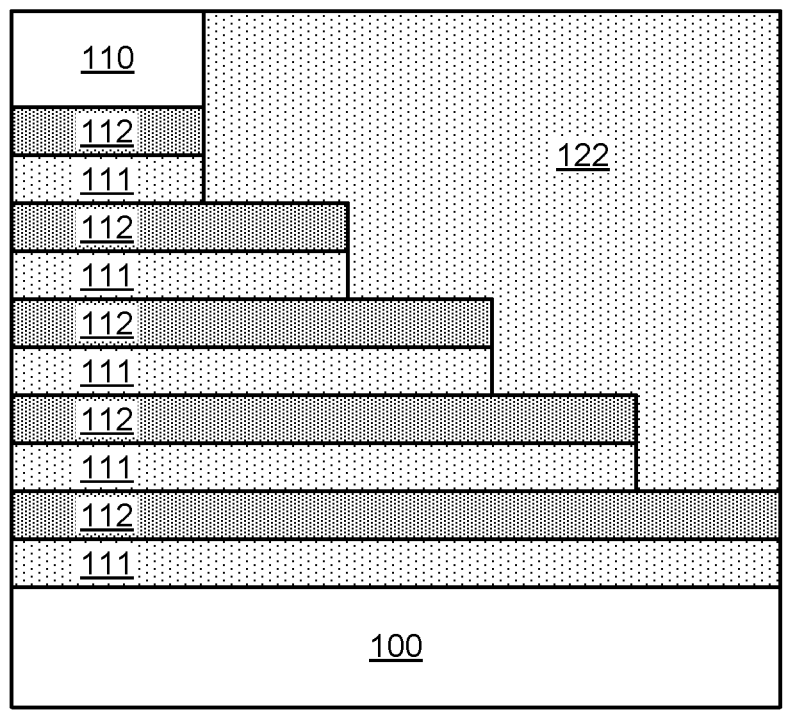
FIGS. 5A, 6A, 7A, 8, and 9 are schematic illustrations of a substrate in a patterning scheme.
Figure 5B:
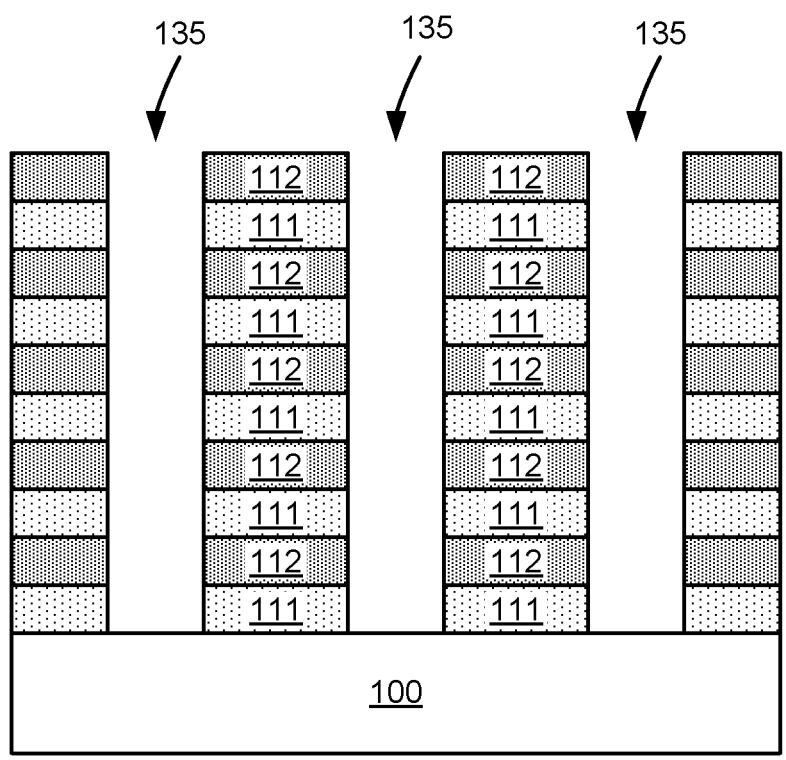
FIGS. 5B, 6B, and 7B are side views of schematic illustrations of substrates depicted in FIGS. 5A, 6A, and 7A, respectively.

FIG. 5A shows an example substrate 100 including the ONON staircase, hardmask 110, and oxide 122 deposited over the substrate. FIG. 5B shows a side view of the substrate 100 after vertical slits 135 are etched and the hardmask 110 is removed.

In operation 190, nitride is selectively etched relative to oxide on the substrate. Etching may be performed using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). The operation 190 removes the nitride layers from the ONON stack such that etch species flow into vertical slits formed in the staircase pattern and selectively etches nitride. It will be understood that the selective etching involves etching a first material at a rate faster than etching a second material. For example, selectively etching nitride relative to oxide means nitride is etched at a faster rate than etching of oxide. Nitride can also be selectively etched using a wet etch process, such as by exposing the substrate to phosphoric acid ($H_3PO_4$), diluted hydrofluoric acid ("DHF") or a mixture of these solutions. However, selectively removing nitride poses a risk for degradation and removal of oxide material at various interfaces, such as at the oxide-oxide interface at the end of each staircase. This is described further below with respect to FIG. 6A.

Figure 6A:
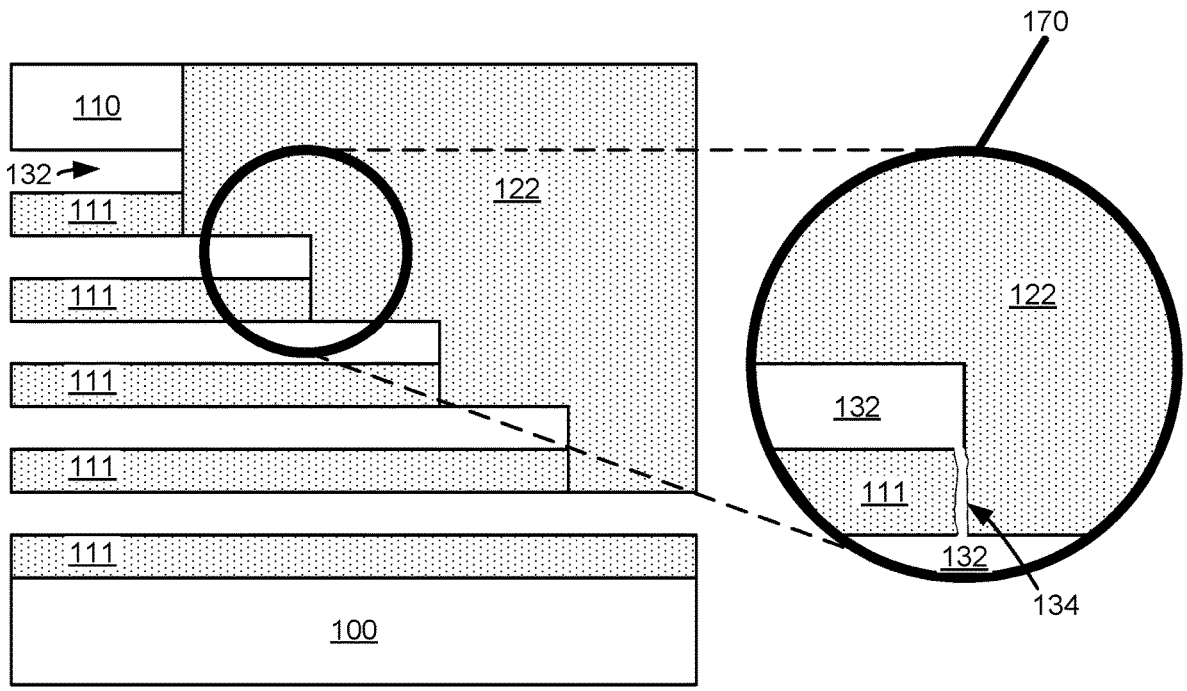
Figure 6B:
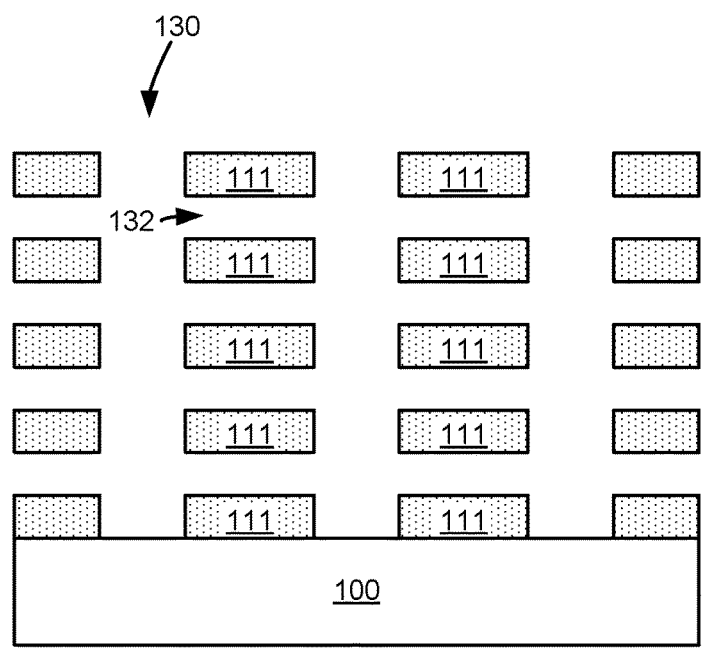

FIG. 6A shows an example schematic illustration of a substrate 100 with horizontal gaps 132 formed from etching the nitride layers 112. As shown in the enlarged view depicted in the circle at 170, a gap 134 may form at the oxide-oxide interface due to the etching species flowing into the gaps 132 and etching away at the oxide during the etching operation. FIG. 6B shows a side view of a cross-section of the substrate whereby gaps 132 are formed from selectively etching nitride.

Figure 7A:
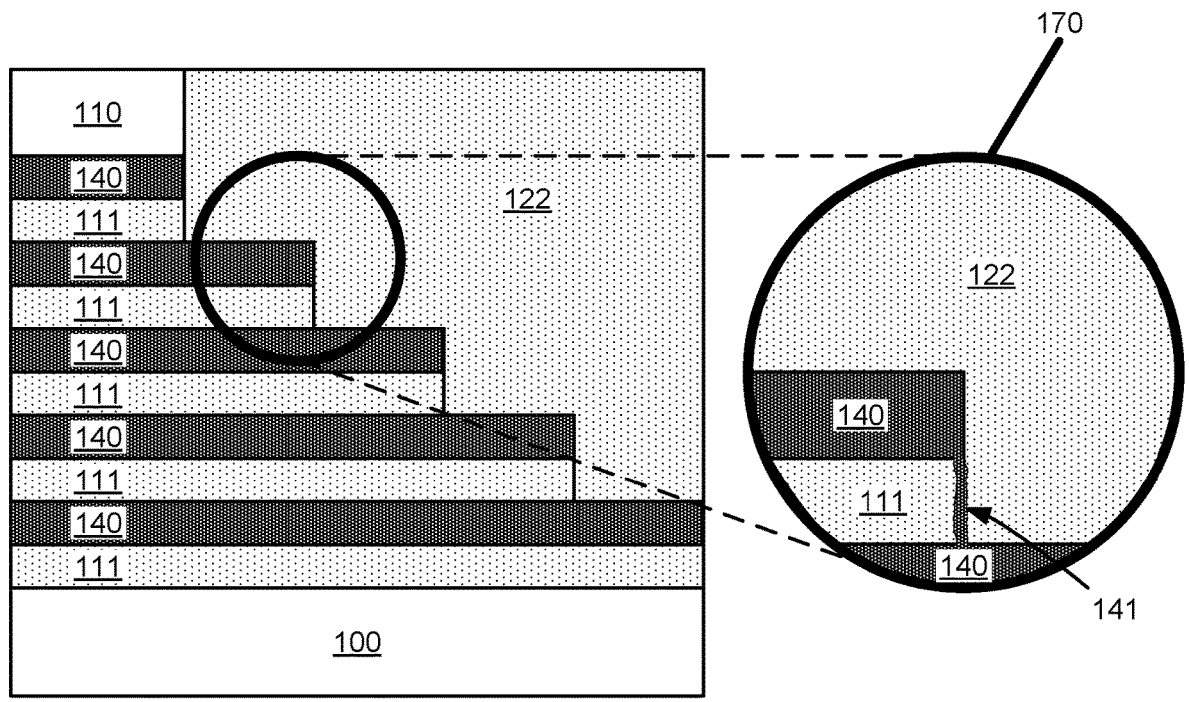
Figure 7B:
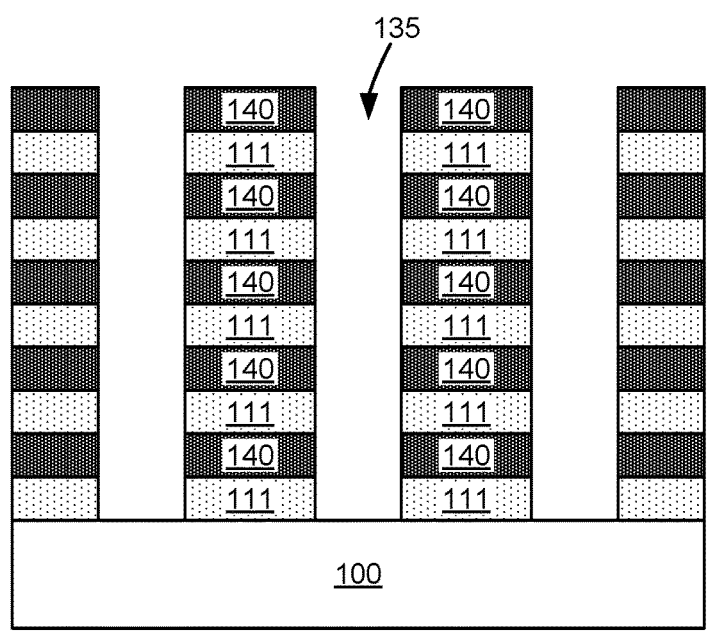

Returning to FIG. 1, in operation 192, tungsten is deposited into the gaps of the substrate to form tungsten wordlines. Tungsten may be deposited by any suitable technique, such as ALD, CVD, PEALD, and PECVD. In some embodiments, one or both of a barrier layer or a tungsten nucleation layer is deposited prior to depositing bulk tungsten. FIG. 7A shows an example of a substrate 100 including deposited tungsten wordlines 140. However, due to the degradation of the oxide at the oxide-oxide interface as shown in the zoomed-in view at 170, tungsten fills in the gap at 141, thereby connecting two wordlines 140, which can cause a short. FIG. 7B shows a schematic illustration of the substrate in 7A at a cross-section from a side view with tungsten 140 deposited in the gaps where nitride was located previously.

Figure 8:
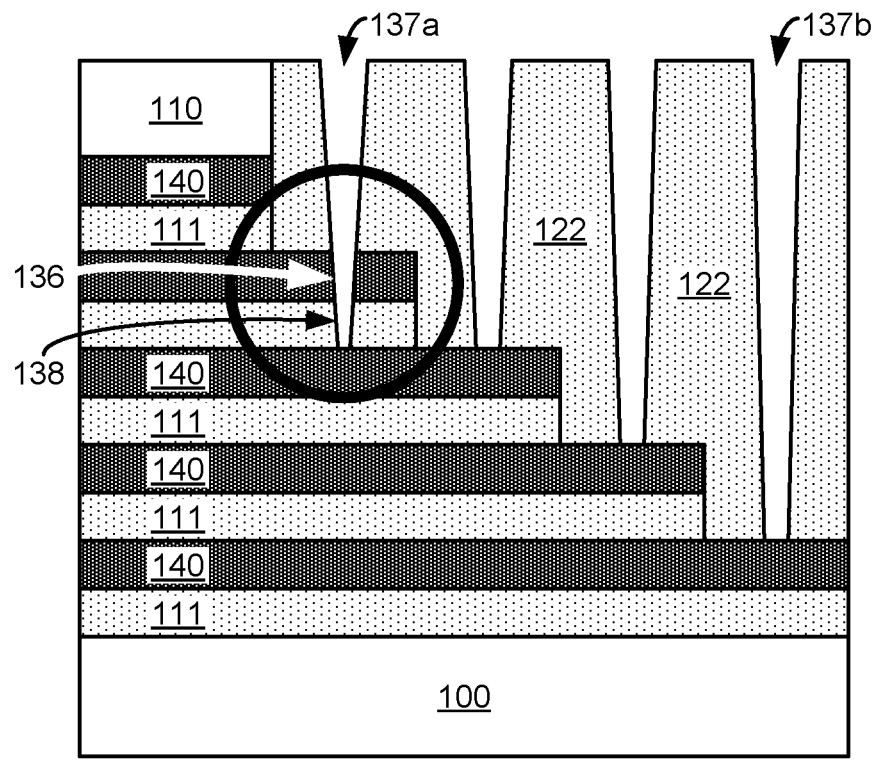

Returning to FIG. 1, in operation 194, the oxide is vertically etched to form vias. The oxide may be etched by dry etching using exposure to an etchant such as one or more of the following gases: $O_2$, Ar, $C_4F_6$, $C_4F_8$, $SF_6$, $CHF_3$, and $CF_4$. FIG. 8 shows an example substrate 100 including the ONON stack in a staircase pattern whereby vias 137 are etched in the oxide 122. However, due to the relative thinness of the tungsten wordline layer, and the lengthy duration of etching used to ensure sufficient vertical etching to etch the deepest vias (e.g., 137b), etching species flows into the vias (e.g., 137a) that are etched for the shallow parts of the oxide, to thus etch through the tungsten layer 136 and even etching through another oxide layer 138. As discussed earlier, such a phenomenon is typically undesirable and referred to as "punchthrough," or "breakthrough," to the layers positioned beneath the intended tungsten wordline contact point or layer.

Figure 9:
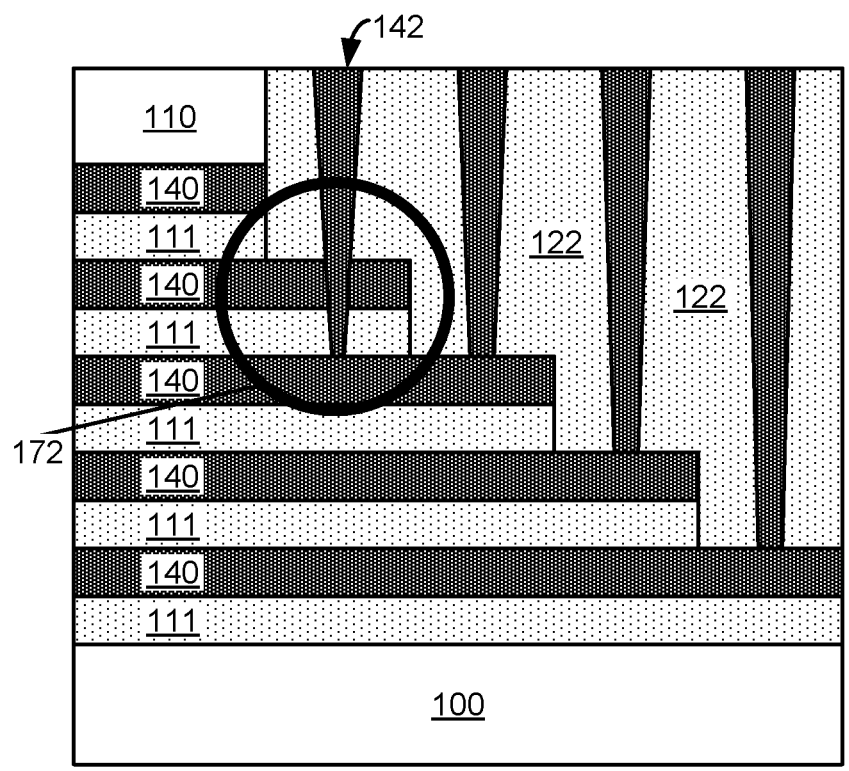

In FIG. 1, in operation 196, tungsten is deposited in the vias to form interconnects to the tungsten wordlines. However, as shown in FIG. 9, since the shallow vias caused breakthrough to the layers below due to the duration used to etch the deep vias, tungsten fills the vias (see filled tungsten via 142) and causes a short as circled in 172 of FIG. 9. Vias vary in depth and may have a depth between about 1 micron and about 12 microns. Shallow vias may be defined as having a depth less than 3.0 microns, such as between about 1.5 microns and 3.0 microns. Deep vias may have a depth greater than 3.0 microns. The critical dimension of vias formed in the oxide may be between about 50 nm and about 500 nm. Vias may be etched using a dry etch process which may involve masking operations to pattern the oxide.

Conventional techniques for forming 3D NAND structures result in degradation at the oxide-oxide interface during selective removal of nitride and punchthrough of tungsten wordlines when etching vias of different depths. Typically, extensive etching techniques performed use a variety of chemistries and patterning processes to mask regions of the substrate to etch vias of different depths using different chemistries and process conditions. Such processes reduce throughput and reduce efficiency of fabrication processes.

Provided herein are methods and apparatuses for forming 3D NAND structures without degrading oxide-oxide interfaces. The methods and apparatuses avoid punchthrough of a tungsten wordline by depositing silicon nitride (SiN) on exposed horizontal portions of nitride layers of the staircase pattern to form SiN pads. Each SiN pad may be formed with a defined height or thickness. The deposition of SiN on exposed horizontal portions of the nitride layers is selective relative to exposed sidewalls of the oxide layers of the staircase pattern. Material deposited inadvertently on exposed sidewall surfaces of the oxide layers may be etched by an isotropic sidewall removal process. Etchants generated from hydrogen-containing or fluorine-containing gases, such as $H_2$ (gas) or $NF_3$ (gas), respectively, are delivered to a reaction process chamber housing the 3D NAND structure. Selective deposition of SiN and anisotropic etching of SiN may be performed as sequential processes with deposition occurring prior to etching, or performed as concurrent processes. The nitride layers of the staircase pattern, along with the SiN pads formed on each nitride layer, are etched selective to the oxide layers to form horizontal gaps and vacant regions corresponding to the locations of the SiN pads. Tungsten fills the horizontal gaps and vacant regions to form tungsten wordlines and landing pads on the wordlines. Each of the landing pads has a sufficient thickness to function as an etch stop layer or a protective barrier to prevent an interconnect from punching through the tungsten wordline.

Figure 10:
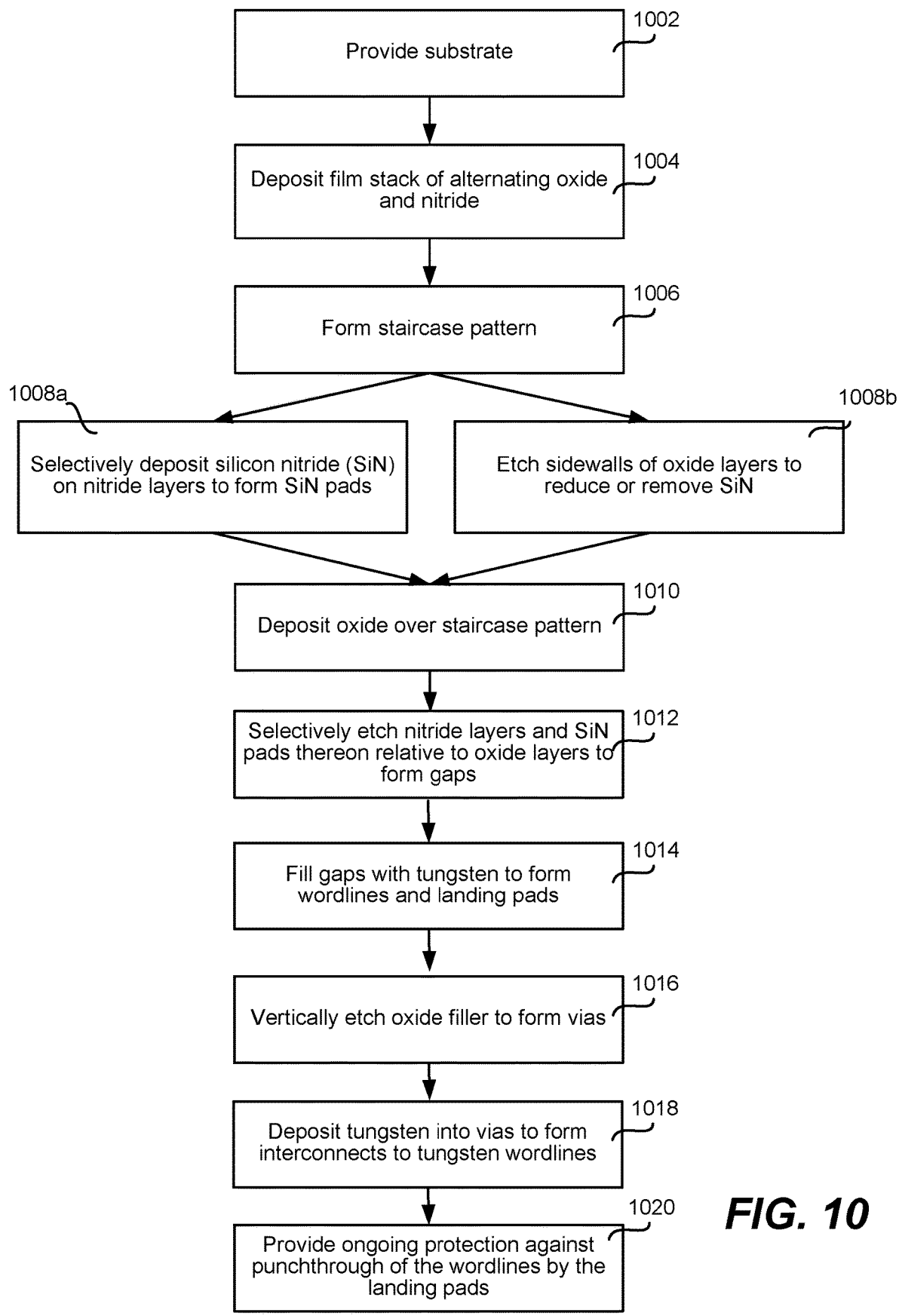
FIG. 10 is a process flow diagram depicting operations for a method.

FIG. 10 is a process flow diagram of operations for a method performed in accordance with some embodiments. That shown in FIG. 10 results in the formation of landing pads at operation 1092. The thickness of each of the landing pads provides ongoing protection against punchthrough of interconnects through wordlines that are also formed with the landing pads at operation 1092. In some embodiments, operations 1002 and 1004 may be the same as, or similar to, operations 182 and 184 presented earlier in FIG. 1, respectively. In operation 1006, a staircase pattern is formed on the substrate. Operation 1006 may be the same as or similar to operation 186 of FIG. 1 as described above.

In operation 1008a, prior to depositing oxide over the staircase pattern in operation 1010, SiN is directionally deposited on exposed horizontal surfaces of the nitride layers, at each nitride layer, of the staircase pattern by high-density plasma chemical vapor deposition (HDP CVD). The deposition is conducted selectively relative to exposed sidewall surfaces of the oxide layers. Under optimal operational conditions, selective deposition will result in no SiN being deposited on the exposed sidewall surfaces of the oxide layers. Thus, SiN material is deposited on exposed horizontal surfaces of each of the nitride layers to form SiN pads thereon, where each of the SiN pads may have a defined height.

The selective deposition of SiN in FIG. 10 is performed by HDP CVD using silicon-containing reactants and nitrogen-containing co-reactants. Examples of silicon-containing reactants include silane ($SiH_4$) and disilane ($Si_2H_6$). Examples of nitrogen-containing co-reactants include molecular nitrogen ($N_2$) and ammonia ($NH_3$).

The silicon-containing reactants and nitrogen-containing co-reactants may be flowed into a reaction process chamber in a HDP CVD process apparatus to react to form SiN for deposition as needed at operation 1008a. SiN may be deposited at a suitable deposition temperature between about 100° C. and about 700° C., or between about 150° C. and about 400° C., such as at about 400° C. Example chamber pressures may be between about 1 Torr and about 10 Torr, or between about 1.5 Torr and about 7 Torr. Although directional in nature to target exposed horizontal surfaces of the nitride layers, the deposition conducted in operation 1008a may, in some embodiments, result in some SiN material being deposited on exposed, vertically oriented, sidewall surfaces of the oxide layers. Etchant species may be flowed into the deposition chamber, either concurrently with the deposition described in operation 1008a, or sequentially after the completion of the deposition, to isotropically etch SiN deposited on the exposed sidewalls surfaces as described at operation 1008b, and as shown in FIGS. 12 through 14B. Process conditions for etching may include, in some embodiments, any of those described earlier with respect to operation 190 of FIG. 1, or as that described above for deposition as conducted in operation 1008a. In some embodiments, SiN deposited on the exposed sidewall surfaces of the oxide layers is removed entirely, or in sufficient amount, that it does not form a continuous film to prevent an electrical short between tungsten wordlines layers upon a tungsten gap-fill at operation 1092, to be described in further detail below.

Figure 14A:
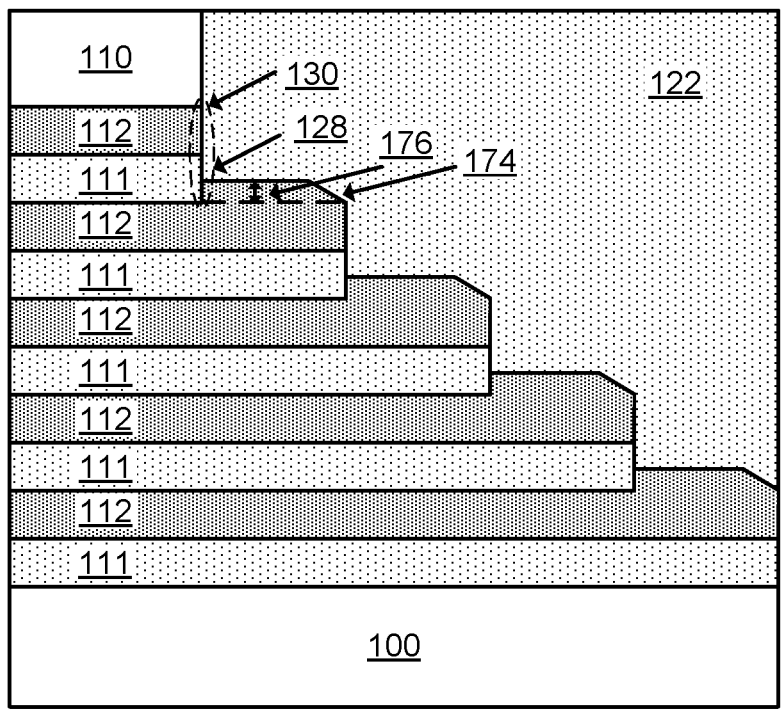
Figure 14B:
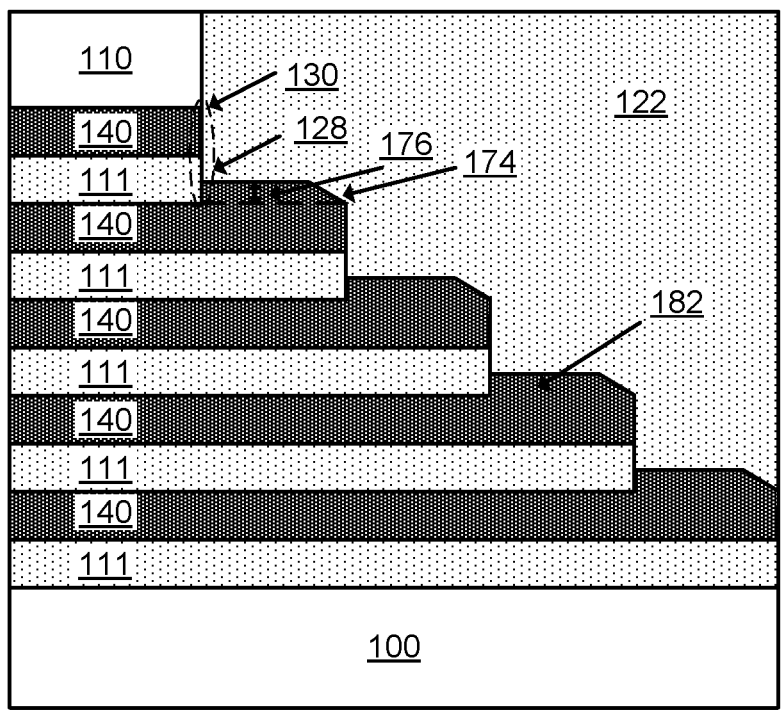

After operations 1008a and 1008b, oxide, also referred to as oxide filler, is deposited over the staircase pattern, including the SiN pads formed on the nitride layers at operation 1010. At operation 1012 the nitride layers with SiN pads extending from each nitride layer are selectively etched relative to the oxide layers and oxide filler to create horizontal gaps between the oxide layers in the staircase pattern, similar to that shown in FIGS. 6A and 6B. The horizontal gaps are later filled with tungsten at operation 1014 through a gap-fill operation to form tungsten wordlines and to replace the SiN pads with landing pads comprising tungsten. The landing pads are formed on the wordlines as shown in FIG. 14B, e.g., landing pads 182 formed on wordlines 140. This operation may be performed using any technique or process condition as described above with respect to operation 192 of FIG. 1. The vacant regions created from etching the SiN pads are filled with tungsten during operation 1092 during the formation of the tungsten wordlines to form landing pads on the tungsten wordlines.

The oxide 122 is then etched to form vias in operation 1016. For example, a via is etched vertically through the oxide, e.g. similar to that shown in FIG. 8, to contact and end at a landing pad extending from a wordlines. Accordingly, multiple vias extend to each of the landing pads formed on the staircase pattern. Formation of longer vias to contact wordlines near the bottom of the staircase pattern may require a relatively longer etch duration compared to the time needed to form shorter vias to contact wordlines near the top of the staircase pattern. Accordingly, an extended etch duration needed to form long vias that extend to wordlines near the bottom of the staircase pattern may result in vias intended to contact wordlines at the top of the staircase pattern punching through such wordlines. The process shown in FIG. 10 protects against such punch-through of vias through wordlines, e.g., wordlines located near the upper layers of the staircase pattern, by forming a landing pads on each wordline. Each landing pad provides additional material through which a given via must penetrate prior to punching through the wordline upon which the landing pad is formed.

At operation 1018, tungsten is deposited into the vias to form interconnects that extend through the oxide filler to contact the landing pads. In addition to providing protection against punchthrough of vias through wordlines, the landing pads also protect against punchthrough of interconnects through the wordlines as well at operation 1020.

The method described with reference to FIG. 10 is further illustrated and described in connection with FIGS. 11 through 15. First, turning to FIG. 11, undesirable SiN accumulations 172 are shown. The accumulations 172 can result from conformal or non-directional nitride-on-nitride deposition at regions 124 on the alternating nitride layers 112 of the staircase pattern. As shown in the enlarged circular region 170 of FIG. 11, the accumulations 172 may be irregular in shape or size due to imperfections in the deposition process and extend over a given nitride layer 112 toward another accumulation 172 on the nitride layer beneath as shown beneath region 124. These irregular deposition patterns may crowd area 126 located between the alternating nitride layers 112, making filling area 126 with oxide 122 more difficult. Further, in some embodiments, irregularities in deposition of nitride at accumulations 172 may lead to contact (not shown in the enlarged region 170) of an accumulation 172 formed on a given nitride layer 112 to another accumulation 172 deposited on the nitride layer 112, which may lead to a short when the nitride layers 112 are later replaced with tungsten wordlines 140, potentially rendering the 3D NAND device unusable. Further, possible deposition of nitride on exposed oxide layer sidewalls may also contribute to a short between the alternating wordlines 140 (not shown in FIG. 11).

Figure 11:
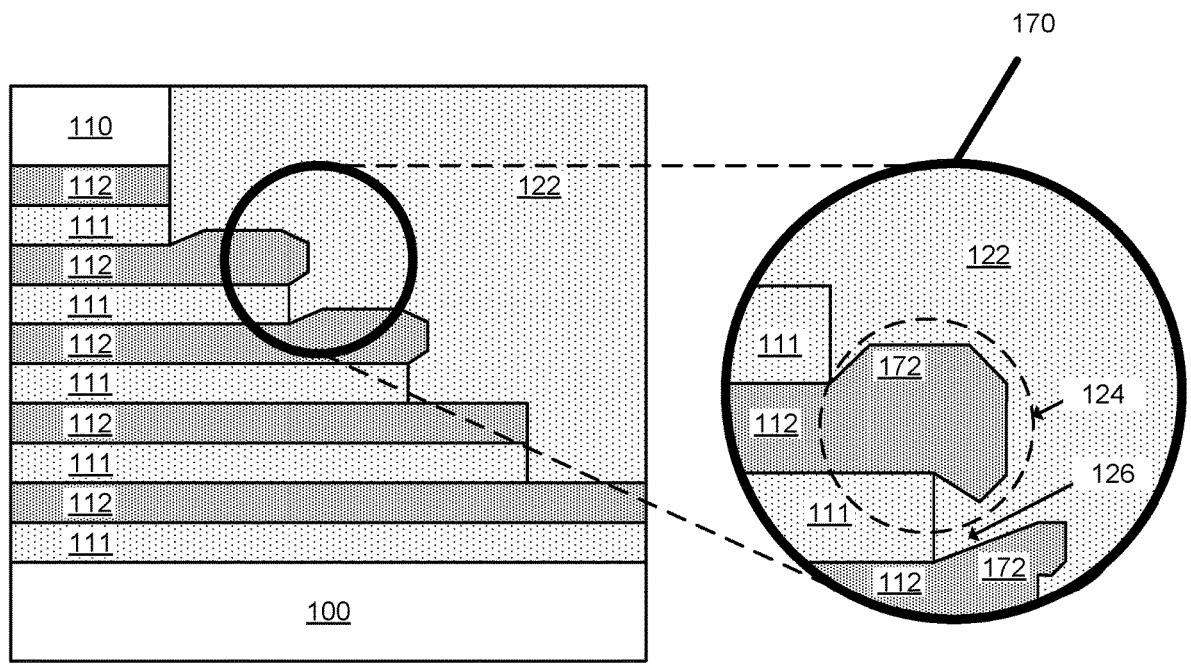
FIGS. 11-15 are schematic illustrations of a substrate in a patterning scheme.
Figure 12:
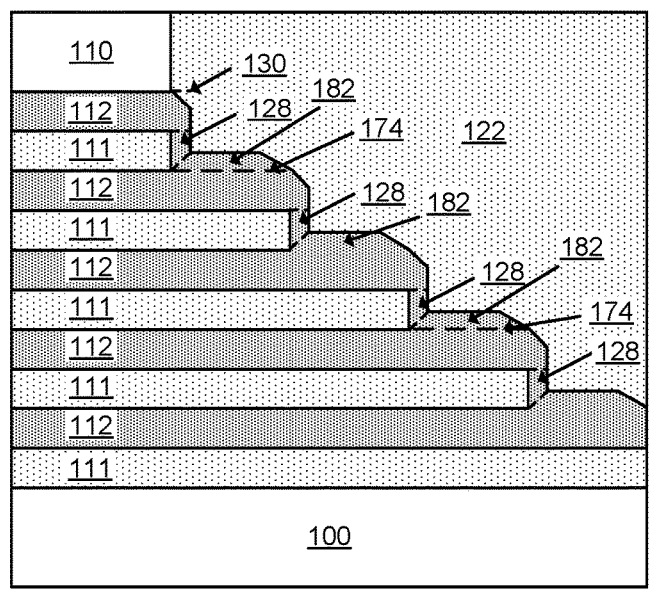

To avoid potential contact of accumulations 172 on nitride layers 112 as shown in FIG. 11 and discussed above, and to achieve a desirable nitride deposition pattern, HDP CVD is conducted to deposit SiN at exposed regions 174 on the alternating nitride layers 112 to form SiN pads 182 as shown in FIG. 12.

HDP CVD as used herein is distinct from plasma-enhanced chemical vapor deposition (PECVD) processes. Inductively coupled HDP CVD process conditions and resulting films are different from capacitively-coupled PECVD processes. For example, various HDP reactors as described herein operate at a pressure less than about 100 mTorr, with a plasma density greater than $10^{11}$ ions/cm$^3$. HDP reactors may ignite plasma at a plasma frequency of 400 kHz for coils and a frequency of 13.56 MHz for the pedestal where the wafer is placed. In a capacitively-coupled plasma reactor, a plasma frequency of 13.56 MHz is used to generate plasma as applied to either a showerhead or the pedestal, and 400 kHz is applied to either the showerhead or the pedestal. Ion energies in HDP reactors may be greater than in PECVD reactors. As a result, film composition and characteristics of films deposited in HDP CVD reactors are different than those deposited in PECVD reactors.

As introduced and discussed in operations 1008a and 1008b in FIG. 10, SiN to be deposited to form SiN pads 182 on exposed horizontal nitride surfaces 174, as shown in FIG. 12, may be formed by flowing a silicon-containing precursor and a nitrogen source into an HDP CVD chamber. An example of a silicon-containing precursor is silane ($SiH_4$). Examples of nitrogen sources are nitrogen gas ($N_2$) and ammonia ($NH_3$).

In some embodiments, HDP CVD may be conducted to target exposed horizontal surfaces 174 on nitride layers 112 of the staircase pattern to deposit SiN thereon. Thus, one SiN pad 182 is formed on each exposed horizontal surface 174 of the staircase pattern as shown in FIG. 12. In some embodiments, HDP CVD is conducted to deposit SiN such that the depth of the SiN pads is approximately half of each nitride layer of the alternating nitride layers 112, each nitride layer being approximately 25 nm to 35 nm thick. Thus, in some embodiments, the SiN pads 182 will have a height 176 ranging from 13 nm to 18 nm. However, deposition processes conducted via HDP CVD still may result in some potential undesirable SiN deposition, on exposed oxide layer sidewalls 128, as shown in FIG. 12, potentially leading to a short between alternating wordlines 140.

Figure 13:
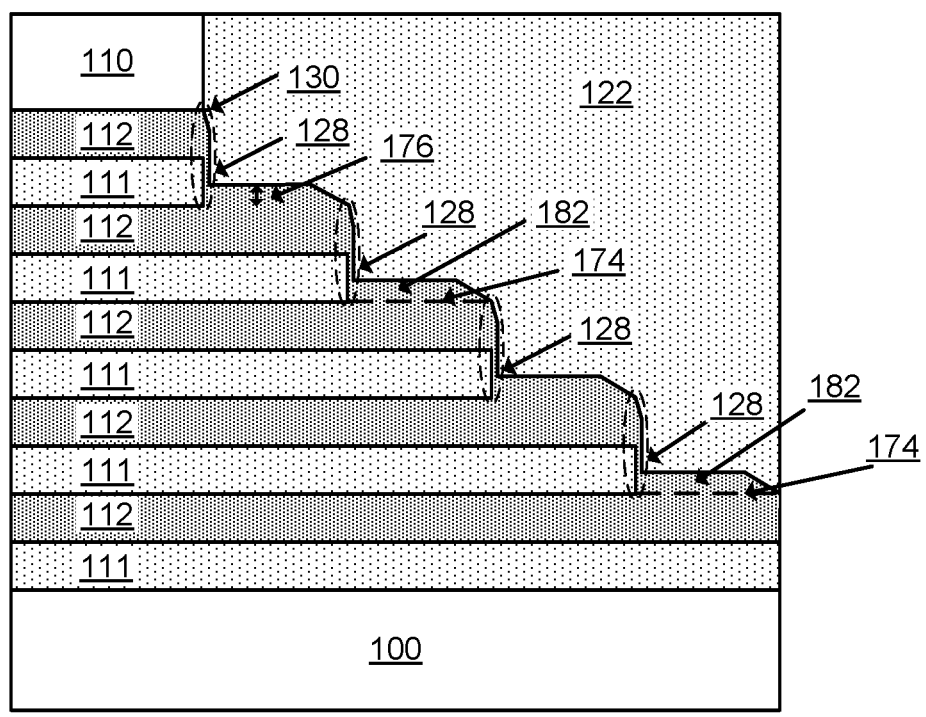
Figure 15:
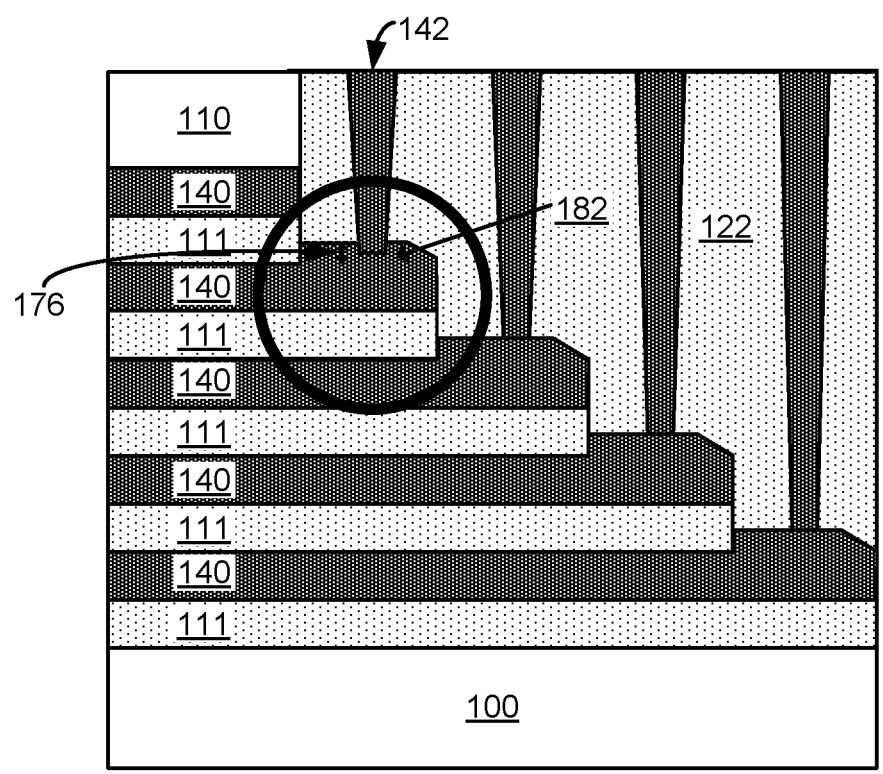

To address SiN deposition on oxide layer sidewalls 128, an isotropic etch is performed to etch SiN deposited on the sidewalls 128 at regions 130, as shown in FIGS. 12 and 13. In some embodiments, various gases may be flowed to a plasma generator responsible for forming etchant species, including radicals, such as atomic fluorine, fluorine (F) ions, or molecular fluorine ($F_2$). Such gases may include one or both of a hydrogen-containing gas, e.g., $H_2$ or $NH_3$, and a fluorine-containing gas, e.g., $F_2$ or $NF_3$, which form etchant species that are delivered to a reaction chamber to selectively etch SiN deposited on sidewalls 128 of oxide layers 111 at regions 130. Etch is performed relative to the SiN pads 182 formed on exposed horizontal surfaces 174 of nitride layers 112 to remove some or all SiN buildup on sidewalls 128, as shown in FIGS. 14A, 14B, and 15, to thus reduce or eliminate the possibility of a short between wordlines 140, e.g. when the nitride layers 112 are replaced with tungsten (W) to form wordlines 140.

Fluorine-containing plasmas etch nitrides selectively relative to oxides and may be used in some embodiments to etch SiN nitride deposited on sidewalls 128. In some embodiments, sidewalls 128 may be removed via an isotropic hydrogen ($H_2$) gas etch to retain SiN deposited on surfaces 174 to form SiN pads 182, as shown in FIG. 13. However, inclusion of oxygen $O_2$ gas during any etch process (e.g., fluorine (F)-based or hydrogen (H)-based) is undesirable as application of $O_2$ may convert exposed nitride surfaces 174 to oxide surfaces to thus potentially reduce the etch rate.

Variance in temperature within the reaction chamber used to conduct etch processes may influence the etch rate. Etch processes may be conducted at, or very close to, deposition temperature, namely from approximately 80° C. to 150° C., where substantial variance in process chamber temperature may influence etch results. Moreover, bias may be applied to the substrate 100 to attract etchant species to deposited SiN material.

Operations 1008a and 1008b as shown in FIG. 10, namely the selective deposition of SiN to form SiN pads 182 and the isotropic etch of SiN deposited on sidewalls 128, may be performed sequentially, with deposition at operation 1008a occurring before etch at operation 1008b, or concurrently as shown in FIG. 10. For concurrent applications, deposition chemistry and etch chemistry may be concurrently flowed into a reaction process chamber to deposit SiN on exposed surfaces of nitride layers 112 to form one SiN pad 182 on each nitride layer 112, while concurrently selectively etching SiN deposited on sidewalls 128 of the oxide layers 111. Also, in some embodiments, deposition and etch processes may occur only once, that is, such processes are not intended to be cyclical.

Deposition of SiN on exposed horizontal surfaces 174 to form SiN pads 182 with concurrent isotropic etch of SiN deposited on the sidewalls 128, has various advantages. For instance, total process completion time may be reduced. In some embodiments, gases used to generate suitable etchant species include hydrogen or ammonia. Flourine-containing gases are generally not used during deposition. Also, in some embodiments, the ratio of the amount of silicon-containing precursor and hydrogen-containing etchant may be controlled to conduct deposition concurrently with etch of SiN deposited on the sidewalls 128. $NH_3$ may be used to supply nitrogen, for SiN formation, as well as hydrogen, for the concurrent etching of SiN deposited on the sidewalls 128. Alternatively, in some embodiments, fluorine-containing gases may be flowed into a reaction chamber along with $H_2$ $NH_3$. Process conditions for the reaction chamber may be tuned to successfully conduct SiN deposition on exposed surfaces of the nitride layers 112 concurrently with etch of SiN deposited on the sidewalls 128.

Next, referring to FIGS. 14A and 14B, the nitride layers 112 and the SiN pads 182 deposited thereon, respectively, are etched relative to oxide on the substrate. Etching is conducted substantially as described for operation 190, as shown in FIG. 1, to remove nitride layers 112 by flowing etchant species vertically through a slit in the ONON stack such that etchant species flow into the vertical slit and selectively etches nitride. Nitride may be selectively etched using a wet etch process, such as by exposing the substrate to phosphoric acid ($H_3PO_4$), or diluted hydrofluoric acid ("DHF"), or a mixture of these solutions. For example, FIG. 6A shows an example schematic illustration of a substrate 100 with horizontal gaps 132 formed from etching nitride.

Following the selective etching of nitride found in nitride layers 112 and SiN pads 182, tungsten is deposited into the gaps of the substrate to form tungsten wordlines 140 and landing pads 180, respectively, as shown in FIG. 14B. Horizontal gaps, similar to gaps 132 shown in FIG. 6A, are filled with tungsten to form tungsten wordlines. Similarly, voids resultant from etch of the SiN pads 182 are filled with tungsten to form landing pads 180. Tungsten may be deposited by any suitable technique, such as ALD, CVD, PEALD, or PECVD, to create wordlines 140 or landing pads 182 which may provide a sufficient stop, also referred to as an "etch stop layer," to prevent punchthrough by interconnects to a subsequent nitride layer positioned beneath the nitride layer to which contact is made, shown in FIG. 15.

Returning to FIG. 13, a situation where SiN is deposited on sidewalls 128 of oxide layers 111 at regions 130 is shown. Thus, upon replacement of the nitride layers 112 with wordlines 140 as described above, the SiN on sidewalls 128 may also be replaced with tungsten, thus potentially leading to a short between the alternating wordlines 140. Thus, the etch processes as described above may remove SiN on sidewalls 128, as shown in FIGS. 14A and 14B, or remove enough SiN such that there is no continuous SiN layer between steps on the staircase pattern as shown in FIG. 13, to prevent against such a short.

FIGS. 14A and 14B illustrate situations where isotropic etch processes have removed all SiN deposition upon regions 130 of sidewalls 128. Thus, risk of a short between alternating wordlines 140 through replacement of SiN deposited on sidewalls of the oxide layers 111 with tungsten is substantially reduced or eliminated entirely.

Similar to that generally shown and discussed with reference to FIGS. 8 and 9, oxide 122 is vertically etched to form vias, later filled with tungsten to form interconnects 142, as shown in FIG. 15. As described for operation 194 for FIG. 1, oxide 122 may be etched by dry etching conducted by exposure to any one or more of the following gases: $O_2$, Ar, $C_4F_6$, $C_4F_8$, $SF_6$, $CHF_3$, and $CF_4$.

Formation of the landing pads 182, as described above and shown in FIG. 15, protects against punchthrough that is shown in FIG. 9. The depth of each landing pad 182 on each wordline 140 provides additional tungsten through which an interconnect 142 must penetrate prior to punching through to below wordlines 140, as shown in FIG. 15.

Accordingly, the possibility of a punchthrough condition is greatly minimized with usage of landing pads 182. A scenario is shown in FIG. 15, where isotropic etch processes etch SiN deposited on sidewalls 128 of the oxide layers 111, thus minimizing risk of a short, and the landing pad 182 prevents etching of a via through an upper wordline 140, thus preventing against punchthrough. Accordingly, the overall structural integrity of the ONON stack is preserved as needed for successful operation.

Apparatus

As semiconductor device dimensions shrink, methods of fabricating semiconductor devices become increasingly sensitive to contamination. For example, semiconductor devices are often fabricated in reactors or chambers including chamber components and chamber walls made of metallic material, such as aluminum. While some semiconductor device fabrication processes do not involve plasma, in some processes that do implement a plasma, chamber components exposed to an in-situ plasma during deposition may flake and peel, thereby increasing the risk of incorporating metallic particles into the films deposited on a wafer. For example, "high density plasma chemical vapor deposition" (HDP CVD) systems generate high density plasma used for integrated circuit applications, such as dielectric film deposition and gap filling. Some systems implement inductively-coupled plasma powered by low frequency radio frequency (LFRF) power on a top dome and capacitively-coupled plasma powered by high frequency (HF) power at an electrostatic chuck (ESC). Gases are flowed ionized and accelerated towards a wafer on the ESC during processing. HDP CVD processing may implement simultaneous sputtering etch during deposition to allow gap filling of high aspect ratio trenches. Components of an HDP CVD system may be susceptible to flaking and peeling when exposed to plasma used during processing.

As noted above, HDP CVD as used herein is distinct from PECVD. HDP CVD process conditions and resulting films are different from capacitively-coupled PECVD processes. For example, various HDP reactors as described herein operate at a pressure less than about 100 mTorr, with a plasma density greater than $10^{11}$ ions/$cm^3$. HDP reactors may ignite plasma at a plasma frequency of 400 kHz for coils and a frequency of 13.56 MHz for the pedestal where the wafer is placed. In a capacitively-coupled plasma reactor, a plasma frequency of 13.56 MHz is used to generate plasma as applied to either a showerhead or the pedestal, and 400 kHz is applied to either the showerhead or the pedestal. Ion energies in HDP reactors may be greater than in PECVD reactors. As a result, film composition and characteristics of films deposited in HDP CVD reactors are different than those deposited in PECVD reactors.

Figure 16:
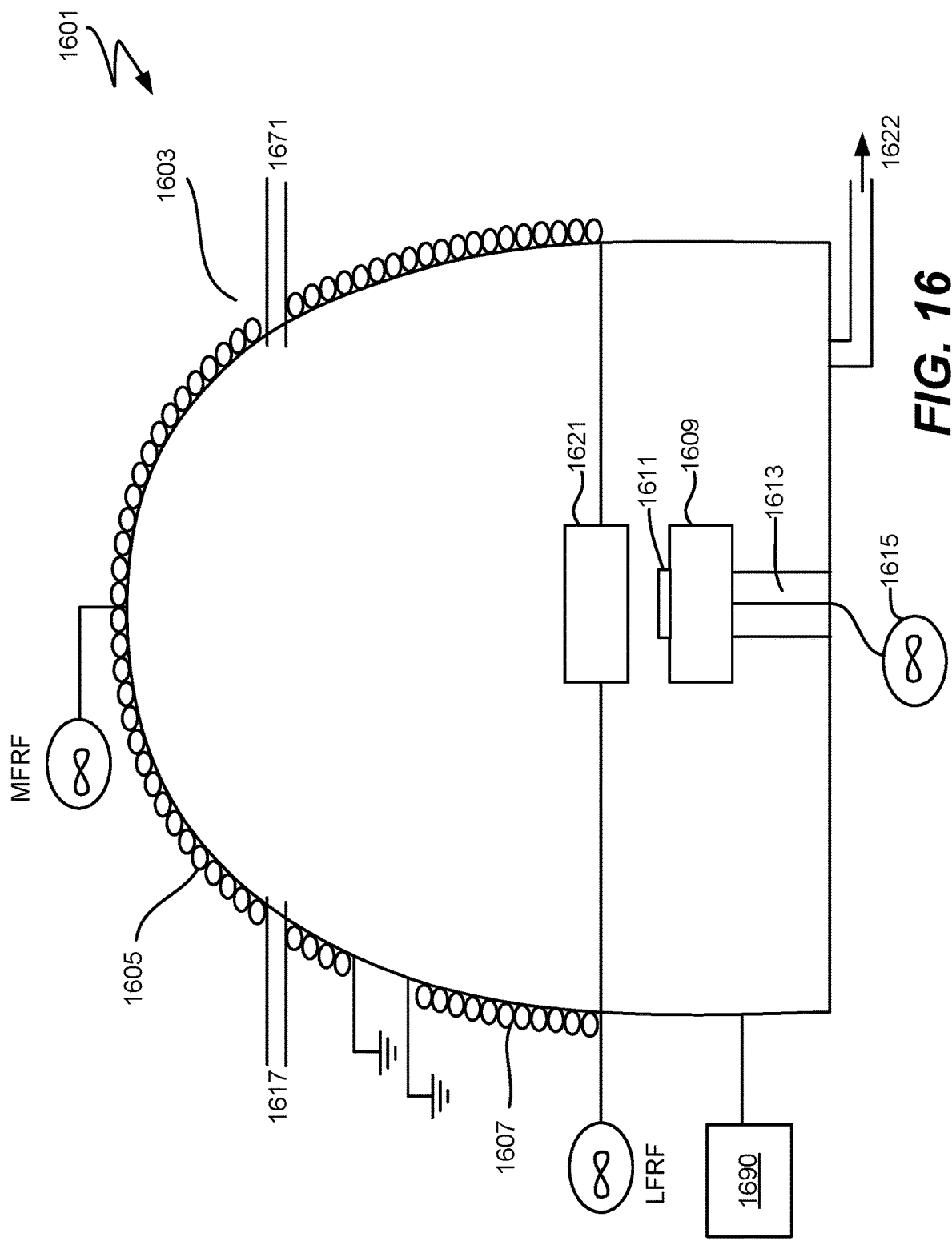
FIG. 16 is a schematic diagram of an example process chamber for performing certain disclosed embodiments.

Disclosed embodiments may be performed in a chamber such as the chamber shown in FIG. 16 as described above. Although a high density plasma chemical vapor deposition (HDP CVD) chamber is depicted in FIG. 18, other reactors or tools for depositing films may be used in various embodiments described herein.

FIG. 16 is a schematic illustration of an example of a HDP CVD reactor suitable for performing disclosed embodiments. Reactor 1601 includes a process chamber 1603, which encloses other components of the reactor and serves to contain the plasma. In some implementations, the process chamber walls are made from aluminum, aluminum oxide, or other suitable material. The embodiment shown in FIG. 16 has two plasma sources: top radio frequency (RF) coil 1605 and side RF coil 1607. Top RF coil 1605 is a medium frequency or MFRF coil and side RF coil 1607 is a low frequency or LFRF coil. In the embodiment shown in FIG. 16, MFRF frequency may be from 430-470 kHz and LFRF frequency from 340-370 kHz. However, disclosed embodiments are not limited to operation in reaction chambers with dual sources, nor RF plasma sources. Any suitable plasma source or sources may be used.

Within the reactor, a wafer pedestal 1609 supports a workpiece 1611. The workpiece 1611 may be a PEC or a wafer. The wafer pedestal 1609 includes a chuck (sometimes referred to as a clamp) to hold (or clamp) the wafer in place. The chuck may be used to clamp an object on the pedestal during various processes. The chuck may be an ESC, a mechanical chuck, or various other types of chuck as are available for use. A gas delivery subsystem including a line 1613 for supplying gas or heat transfer liquid to the wafer pedestal 1609 controls the temperature of workpiece 1611. The wafer pedestal 1609 and gas delivery subsystem can facilitate maintaining appropriate wafer temperatures.

A high frequency RF of HFRF source 1615 serves to electrically bias the workpiece 1611 and draw charged gas species onto the workpiece 1611 during various processes. Electrical energy from source 1615 is coupled to the workpiece 1611 via an electrode or capacitive coupling, for example. Note that the bias applied to the workpiece 1611 may not be an RF bias. Other frequencies and DC bias may be used as well.

The process gases are introduced via one or more inlets 1617. The gases may be premixed or not. The process gases may be introduced through a gas supply inlet mechanism including orifices. In some embodiments, at least some of the orifices orient the process gas along an axis of injection intersecting an exposed surface of the workpiece 1611 at an acute angle. Further, the process gases may be introduced from a primary gas ring 1621, which may or may not direct the gases toward the pedestal. In some embodiments, process gases may be introduced from one or more gas rings (not shown) in addition to primary gas ring 1621. Injectors may be connected to the primary gas ring 1621 to direct at least some of the gases or gas mixtures into the chamber and toward the pedestal. Note that injectors, gas rings or other mechanisms for directing process gas toward the wafer may not be used in some embodiments. The sonic front caused by a process gas entering the chamber will itself cause the gas to rapidly disperse in all directions—including toward the workpiece 1611. Process gases exit chamber 1603 via an outlet 1622. A vacuum pump (e.g., a turbomolecular pump) typically draws process gases out and maintains a suitably low pressure within the reactor. Reactor 1601 may be controlled using controller 1690. Controller 1690 may include machine-readable instructions for performing various operations disclosed herein. Further description regarding the controller 1690 is provided below.

As shown in FIG. 16, reactor 1601 includes a controller 1690 for controlling operations in accordance with disclosed embodiments. The controller 1690 may be used to control various parameters, such as flow rate and pressure for gas flow to the pedestal 1609 via inlet 1613, bias power for an electrostatic chuck (ESC), plasma power for the MFRF coils 1605 and MFRF coils 1607, pedestal temperature, chamber pressure, gas flow to the process chamber 1603, transfer of the workpiece 1611 in and out of the chamber 1603, and other operations.

Figure 17:
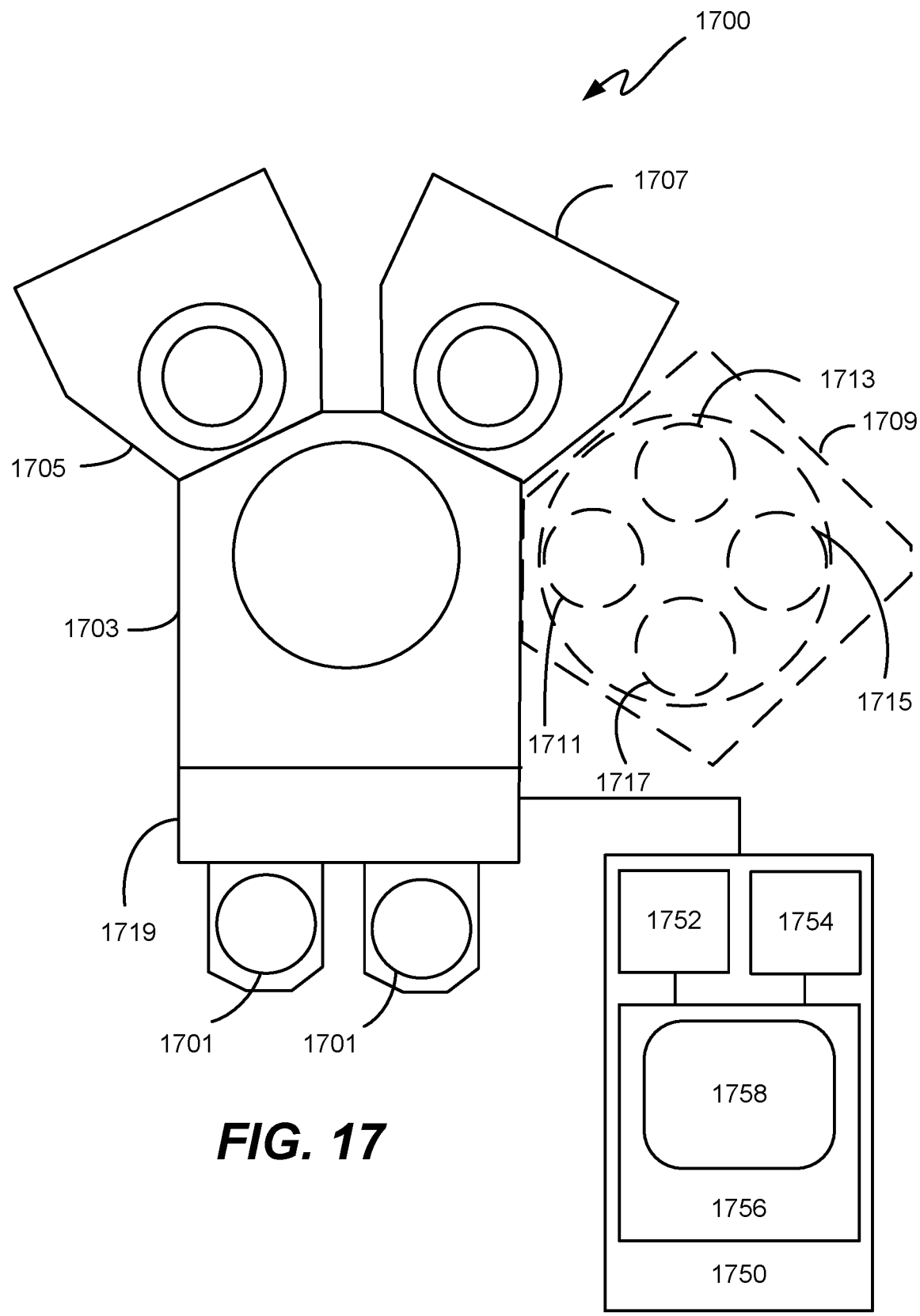
FIG. 17 is a schematic diagram of an example process tool for performing certain disclosed embodiments.

In some embodiments, reactor 1601 shown in FIG. 16 is part of a tool for processing one or more wafers. An example of a tool including one or more reactors is provided in FIG. 17. FIG. 17 is a block diagram of a plasma processing system suitable for conducting a multi-step deposition process in accordance with disclosed embodiments. The system 1700 includes a transfer module 1703, such as the wafer transfer system (WTS) used on the SPEED™ platform available from Lam Research Corporation of Fremont, Calif. The transfer module 1703 provides a clean, pressurized environment to minimize the risk of contamination of workpieces, such as wafers, being processed as they are moved between the various processing stages. Mounted on the transfer module 1703 are one or more HDP CVD modules or process chambers 1705, such as Lam SPEED™ reactors, available from Lam Research Corporation of Fremont, Calif. The etch modules 1707 may be a Lam atomic layer removal (ALR) reactor or Kiyo™ reactor. These etch reactors may be mounted on the same or separate platforms as the deposition reactors.

The system may optionally include a chamber 1709 capable of performing PECVD or atomic layer deposition (ALD) process. Chamber 1709 may include multiple stations 1711, 1713, 1715, and 1717 that may sequentially perform deposition or removal operations or protective electrostatic chuck cover (PEC) cleaning operations. The system 1700 also includes one or more (in this case two) wafer source modules 1701 where wafers are stored before and after processing. A device (generally a robot arm unit) in the transfer module 1703 moves the wafers among the modules mounted on the transfer module 1703.

Wafers are transferred by the robot arm between the HDP CVD reactors 1705 and/or the plasma etch reactor 1707 for deposition and etch back processing, respectively. The robot arm may also transfer wafers between the conditioning layer deposition module 1709 and the other chambers. In one embodiment, a single etch reactor can support two SPEED deposition modules 1705 in this application with a high throughput of about 15-16 wafers per hour (wph). In other embodiments, two etch reactors 1707 may support one or more SPEED deposition modules 1705.

Disclosed embodiments may also be practiced without a plasma etch chamber. For example, a single chamber may be configured for both HDP CVD deposition and reactive plasma etch. For example, the Lam SPEED HDP-CVD reactors are capable of conditioning, deposition, and plasma etch with a throughput similar to that of using separate reactors. Given the details and parameters provided herein, a single chamber may be configured, for example, a plasma reactor, with equipment, for example the various plasma sources described herein, for deposition (HDP CVD) and reactive plasma etch (e.g., in-situ or downstream plasma source).

FIG. 17 also depicts an embodiment of a system controller 1750 employed to control process conditions and hardware states of process tool 1700. System controller 1750 may provide program instructions for implementing the above-described processes. The program instructions may control a variety of process parameters, such as DC power level, RF bias power level, pressure, temperature, etc. The instructions may control the parameters to condition a chamber and perform deposition operations on a PEC prior to processing wafers in a batch according to various embodiments described herein.

In some implementations, a controller 1750 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1750, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

In some embodiments, system controller 1750 controls all of the activities of process tool 1700. System controller 1750 may include one or more memory devices 1756, one or more mass storage devices 1754, and one or more processors 1752. Processor 1752 may include a CPU or computer, analog and/or digital input/output connections, stepper motor controller boards, etc. System controller 1750 executes system control software 1758 stored in mass storage device 1754, loaded into memory device 1756, and executed on processor 1752. Alternatively, the control logic may be hard coded in the controller 1750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1758 may include instructions for controlling the transfer of PEC into and out of a process chamber, transfer of wafers into and out of a process chamber, timing of gases, mixture of gases, amount of gas flow, chamber and/or station pressure, backside gas flow pressure, chamber and/or reactor temperature, wafer temperature, bias power, target power levels, RF power levels, pedestal, chuck and/or susceptor position, and other parameters of a particular process performed by process tool 1700.

System control software 1758 may be configured in any suitable way. For example, various process tool component subroutines or control objects may be written to control operation of the process tool components necessary to carry out various process tool processes. System control software 1758 may be coded in any suitable computer readable programming language.

The controller 1750, in some implementations, may be a part of or coupled to a computer that is integrated with, coupled to the system, otherwise networked to the system, or a combination thereof. For example, the controller 1750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 1750 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 1750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, system control software 1758 may include input/output control (IOC) sequencing instructions for controlling the various parameters described above. Other computer software and/or programs stored on mass storage device 1754 and/or memory device 1756 associated with system controller 1750 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load a wafer or PEC onto pedestal 1718 and to control the spacing between the wafer or PEC and other parts of process tool 1700. A process gas control program may include code for controlling gas composition (e.g., conditioning process gases, deposition gases, helium gas or other gas for backside flow, carrier gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, pressure of gas introduced to backside of PEC during conditioning operations, etc.

A heater control program may include code for controlling the current to a heating unit that is used to heat the workpiece. Alternatively, the heater control program may control delivery of a heat transfer gas (such as helium) to the wafer. A plasma control program may include code for setting RF power levels applied to the process electrodes and the bias in one or more process stations in accordance with the embodiments herein. A pressure control program may include code for maintaining the pressure in the reaction chamber in accordance with the embodiments herein.

In some embodiments, there may be a user interface associated with system controller 1750. The user interface may include a display screen, graphical software displays of the apparatus and/or process conditions, and user input devices such as pointing devices, keyboards, touch screens, microphones, etc.

In some embodiments, parameters adjusted by system controller 1750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1750 from various process tool sensors. The signals for controlling the process may be output on the analog and digital output connections of process tool 300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate having alternating oxide layers and nitride layers arranged in a staircase pattern, wherein the each of the nitride layers has an exposed horizontal surface; and
depositing silicon nitride (SiN) via high-density plasma chemical vapor deposition (HDP CVD) on the substrate by (a) exposing the exposed horizontal surfaces of the nitride layers at each layer to deposition chemistry to form SiN pads; and (b) exposing sidewalls of the oxide layers of the staircase pattern to an etchant to selectively etch SiN deposited thereon relative to the SiN pads wherein transitioning from depositing the SiN to selectively etching the SiN deposited on the sidewalls of the oxide layers comprises lowering a bias applied to the substrate.

2. The method of claim 1, wherein the deposition of SiN via HDP CVD comprises:
simultaneously depositing SiN on the exposed horizontal surfaces of the nitride layers to form the SiN pads and selectively etching SiN deposited on sidewalls of the oxide layers of the staircase pattern relative to the SiN pads.

3. The method of claim 1, wherein the etchant comprises plasma species generated from one of hydrogen gas ($H_2$), a fluorine (F) containing gas, or a combination thereof.

4. The method of claim 1, wherein depositing SiN via HDP CVD comprises flowing a silicon-containing reactant and a nitrogen-containing reactant to a HDP CVD chamber.

5. The method of claim 4, wherein depositing SiN via HDP CVD further comprises flowing hydrogen gas ($H_2$) to the HDP CVD chamber.

6. The method of claim 1, further comprising:
replacing the nitride layers with tungsten wordlines; and
replacing the SiN pads with tungsten landing pads.

7. The method of claim 6, further comprising:
after depositing the SiN via HDP CVD, depositing an oxide filler over the staircase pattern;
etching the oxide filler to form vertical vias in the oxide filler which extend to the tungsten wordlines, wherein the oxide filler is etched selective to the tungsten landing pads; and
depositing tungsten in the vias to form tungsten interconnects which extend to the tungsten wordlines.

8. The method of claim 7, further comprising:
positioning the tungsten landing pads to protect against punchthrough of one or more of the tungsten wordlines by one or more of the vias.

9. The method of claim 1, wherein each of the alternating oxide layers and nitride layers is between about 10 nm to about 100 nm in thickness.

10. The method of claim 7, wherein the vias have varying depths.

11. A method comprising:
providing a substrate with nitride layers interspersed between oxide layers forming a staircase structure, wherein portions of the nitride layers are exposed;
depositing SiN from a silicon-containing reactant and a nitrogen-containing reactant via high-density plasma chemical vapor deposition (HDP CVD) on flat surfaces of the exposed portions of the nitride layers while applying a bias to the substrate wherein the depositing of the silicon-containing reactant and a nitrogen-containing reactant is anisotropic; and
removing material deposited on sidewalls of the oxide layers of the staircase structure by etching the material deposited on the sidewalls selective to the material on the flat surfaces of the exposed portions of the nitride layers.

12. The method of claim 11, wherein etching the material deposited on the sidewalls comprises exposing the sidewalls to plasma species generated from hydrogen gas ($H_2$), a fluorine (F) containing gas, or a combination thereof.

13. The method of claim 11, wherein the depositing and the removing the material deposited on the sidewalls are performed simultaneously.

14. The method of claim 11, wherein the depositing and the removing the material deposited on the sidewalls are performed sequentially.

15. A method comprising:
providing a substrate having alternating oxide layers and nitride layers arranged in a staircase pattern, wherein the each of the nitride layers has an exposed horizontal surface; and depositing SiN on the exposed horizontal surfaces of the nitride layers to form SiN pads and simultaneously selectively etching SiN deposited on sidewalls of the oxide layers of the staircase pattern relative to the SiN pads.

16. The method of claim 15, wherein depositing SiN further comprises flowing a silicon-containing reactant, a nitrogen-containing reactant, and hydrogen gas into HDP CVD chamber at the same time to deposit SiN via HDP CVD.

* * * * *